(12) United States Patent
Rafac et al.

(10) Patent No.: US 12,078,934 B2
(45) Date of Patent: Sep. 3, 2024

(54) LASER SYSTEM FOR TARGET METROLOGY AND ALTERATION IN AN EUV LIGHT SOURCE

(71) Applicant: ASML Netherlands B.V., Veldhoven (NL)

(72) Inventors: Robert Jay Rafac, Encinitas, CA (US); Igor Vladimirovich Fomenkov, San Diego, CA (US)

(73) Assignee: ASML Netherlands B.V., Veldhoven (NL)

(*) Notice: Subject to any disclaimer, the term of this patent is extended or adjusted under 35 U.S.C. 154(b) by 618 days.

(21) Appl. No.: 17/277,027

(22) PCT Filed: Aug. 12, 2019

(86) PCT No.: PCT/EP2019/071536
§ 371 (c)(1),
(2) Date: Mar. 17, 2021

(87) PCT Pub. No.: WO2020/064195
PCT Pub. Date: Apr. 2, 2020

(65) Prior Publication Data
US 2021/0263422 A1 Aug. 26, 2021

Related U.S. Application Data

(60) Provisional application No. 62/736,012, filed on Sep. 25, 2018.

(51) Int. Cl.
G03F 7/00 (2006.01)
H05G 2/00 (2006.01)

(52) U.S. Cl.
CPC ...... *G03F 7/70133* (2013.01); *G03F 7/70025* (2013.01); *G03F 7/70033* (2013.01);
(Continued)

(58) Field of Classification Search
CPC ............ G03F 7/70133; G03F 7/70025; G03F 7/70033; G03F 7/70041; G03F 7/70558; H05G 2/008
See application file for complete search history.

(56) References Cited

U.S. PATENT DOCUMENTS 7,372,056 B2   5/2008  Bykanov et al.
7,598,509 B2  10/2009  Ershov et al.
(Continued)

FOREIGN PATENT DOCUMENTS

CN    105453704 A    3/2016
CN    105723811 A    6/2016
(Continued)

OTHER PUBLICATIONS

Christopher Smith, European International Searching Authority, International Search Report and Written Opinion, corresponding PCT Application No. PCT/EP2019/071536, mailed Nov. 19, 2019, 9 pages total.
(Continued)

*Primary Examiner* — David A Vanore
(74) *Attorney, Agent, or Firm* — DiBerardino McGovern IP Group LLC

(57) ABSTRACT

Disclosed is a system and method for generating EUV radiation in which a laser is used in a multistage process to illuminate without altering a target material and then irradiate the target material to alter a target material with the illumination stage being used to determine the timing for firing during the irradiation stage or stages.

3 Claims, 11 Drawing Sheets

(52) U.S. Cl.
CPC ...... *G03F 7/70041* (2013.01); *G03F 7/70558* (2013.01); *H05G 2/008* (2013.01)

(56) References Cited

U.S. PATENT DOCUMENTS

| | | | | |
|---|---|---|---|---|
| 7,639,364 | B2* | 12/2009 | Rafac | G01J 3/28 |
| | | | | 356/454 |
| 7,641,349 | B1* | 1/2010 | Chrobak | G02B 5/0891 |
| | | | | 359/845 |
| 7,643,529 | B2* | 1/2010 | Brown | G03F 7/7055 |
| | | | | 372/55 |
| 7,872,245 | B2* | 1/2011 | Vaschenko | H05G 2/008 |
| | | | | 359/359 |
| 7,885,309 | B2* | 2/2011 | Ershov | H01S 3/225 |
| | | | | 372/57 |
| 7,916,388 | B2* | 3/2011 | Bykanov | H01S 3/2325 |
| | | | | 359/333 |
| 7,928,416 | B2* | 4/2011 | Fomenkov | H05G 2/008 |
| | | | | 372/55 |
| 8,000,212 | B2* | 8/2011 | Senekerimyan | H05G 2/008 |
| | | | | 250/504 R |
| 8,111,377 | B2* | 2/2012 | Cosijns | G03F 7/70775 |
| | | | | 355/75 |
| 8,112,752 | B2* | 2/2012 | Van De Ven | G06F 9/4887 |
| | | | | 700/121 |
| 8,158,960 | B2* | 4/2012 | Vaschenko | H05G 2/006 |
| | | | | 378/143 |
| 8,189,195 | B2* | 5/2012 | Den Boef | G03F 1/84 |
| | | | | 356/636 |
| 8,304,752 | B2* | 11/2012 | Fomenkov | H01S 3/2232 |
| | | | | 250/354.1 |
| 8,368,032 | B2* | 2/2013 | Labetski | G03F 7/70033 |
| | | | | 250/493.1 |
| 8,384,882 | B2* | 2/2013 | Compen | G03B 27/58 |
| | | | | 355/72 |
| 8,530,871 | B2* | 9/2013 | Vaschenko | G03F 7/70033 |
| | | | | 250/504 R |
| 8,598,549 | B2* | 12/2013 | Bowering | G03F 7/7015 |
| | | | | 250/492.1 |
| 8,604,452 | B2* | 12/2013 | Ershov | H01S 3/2383 |
| | | | | 250/493.1 |
| 8,633,459 | B2* | 1/2014 | Bykanov | H05G 2/008 |
| | | | | 250/493.1 |
| 8,653,491 | B2 | 2/2014 | Partlo et al. | |
| 8,654,438 | B2* | 2/2014 | Hou | H01S 3/0078 |
| | | | | 359/333 |
| 8,663,881 | B2* | 3/2014 | Buurman | G03F 7/70033 |
| | | | | 430/30 |
| 8,680,495 | B1* | 3/2014 | Tao | H05G 2/008 |
| | | | | 250/493.1 |
| 8,681,312 | B2* | 3/2014 | Straaijer | G01N 21/211 |
| | | | | 355/53 |
| 8,687,167 | B2* | 4/2014 | Padiy | G03F 9/7011 |
| | | | | 355/53 |
| 8,872,143 | B2* | 10/2014 | Rafac | H05G 2/008 |
| | | | | 378/143 |
| 8,993,976 | B2* | 3/2015 | Graham | G03F 7/70033 |
| | | | | 250/395 |
| 9,113,539 | B2* | 8/2015 | Schimmel | G03F 7/70883 |
| 9,195,128 | B2* | 11/2015 | Butler | G03F 9/7096 |
| 9,241,395 | B2 | 1/2016 | Senekerimyan et al. | |
| 9,271,381 | B2* | 2/2016 | Fleurov | H05G 2/008 |
| 9,298,110 | B2* | 3/2016 | Steinhoff | G03F 7/70916 |
| 9,301,382 | B2* | 3/2016 | Ershov | H05G 2/006 |
| 9,357,625 | B2* | 5/2016 | Tao | H05G 2/008 |
| 9,380,691 | B2* | 6/2016 | Tao | H05G 2/003 |
| 9,442,380 | B2* | 9/2016 | Badie | H05G 2/006 |
| 9,497,840 | B2 | 11/2016 | Wehrens | |
| 9,500,953 | B2* | 11/2016 | Hoogkamp | G03F 7/70141 |
| 9,516,730 | B2* | 12/2016 | Fleurov | H05G 2/008 |
| 9,544,984 | B2* | 1/2017 | Bykanov | G21B 1/23 |
| 9,606,457 | B2* | 3/2017 | Van Den Nieuwelaar | |
| | | | | G03F 7/70525 |
| 9,645,510 | B2* | 5/2017 | Op 'T Root | G03F 7/70558 |
| 9,696,633 | B2* | 7/2017 | Onvlee | G03F 7/70816 |
| 9,713,240 | B2* | 7/2017 | Riggs | H05G 2/003 |
| 2006/0140227 | A1 | 6/2006 | Rocca et al. | |
| 2008/0149862 | A1 | 6/2008 | Hannson et al. | |
| 2010/0258750 | A1 | 10/2010 | Partlo et al. | |
| 2012/0147349 | A1 | 6/2012 | van Dijsseldonk et al. | |
| 2013/0043401 | A1 | 2/2013 | Graham et al. | |
| 2014/0246607 | A1 | 9/2014 | Bykanov et al. | |
| 2014/0264091 | A1 | 9/2014 | Fleurov et al. | |
| 2015/0041659 | A1 | 2/2015 | Graham et al. | |
| 2015/0083936 | A1 | 3/2015 | Wehrens | |
| 2015/0208494 | A1 | 7/2015 | Rafac et al. | |
| 2016/0007434 | A1 | 1/2016 | Tao et al. | |
| 2016/0011056 | A1 | 1/2016 | Liu et al. | |
| 2017/0171955 | A1 | 6/2017 | Ueno et al. | |
| 2017/0311429 | A1 | 10/2017 | Rafac et al. | |

FOREIGN PATENT DOCUMENTS

| | | |
|---|---|---|
| CN | 105935007 A | 9/2016 |
| TW | 201117675 A | 5/2011 |
| WO | 2016139386 A1 | 9/2016 |
| WO | 2018057399 A1 | 3/2018 |

OTHER PUBLICATIONS

Research Disclosure, Research Disclosure database No. 605009 (2014).

Office Action and Search Report, counterpart Taiwanese Patent Application No. 108130376, mailed May 2, 2023, 22 pages total (including English translation of 9 pages).

* cited by examiner

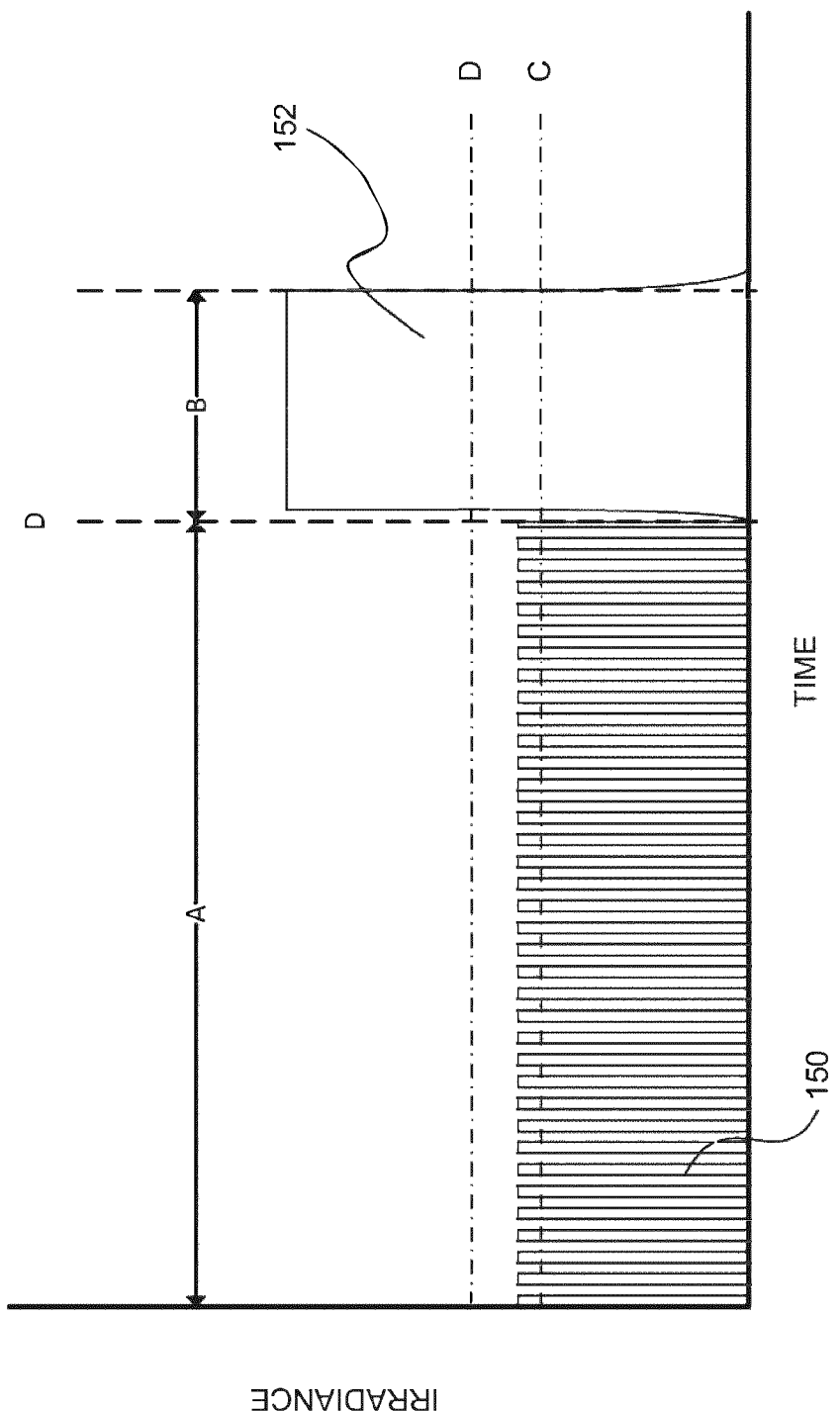

LASER SYSTEM FOR TARGET METROLOGY AND ALTERATION IN AN EUV LIGHT SOURCE

CROSS-REFERENCE TO RELATED APPLICATIONS

This application claims priority of U.S. application 62/736,012 which was filed on Sep. 25, 2018 and which is incorporated herein in its entirety by reference.

FIELD

The present disclosure relates to light sources which produce extreme ultraviolet light by excitation of a target material, in particular to the measurement, e.g., detection, and alteration, e.g., preparation and/or ionization, of a target material in such sources.

BACKGROUND

Extreme ultraviolet ("EUV") light, for example, electromagnetic radiation having wavelengths of around 50 nm or less (also sometimes referred to as soft x-rays), and including light at a wavelength of about 13 nm, is used in photolithography processes to produce extremely small features in substrates, for example, silicon wafers Methods for generating EUV light include, but are not limited to, altering the physical state of the target material into a plasma state. The target material includes an element, for example, xenon, lithium, or tin, with an emission line in the EUV range. In one such method, often termed laser produced plasma ("LPP"), the required plasma is produced by irradiating a target material, for example, in the form of a droplet, stream, or cluster of target material, with an amplified light beam that can be referred to as a drive laser. For this process, the plasma is typically produced in a sealed vessel, for example, a vacuum chamber, and monitored using various types of metrology equipment.

$CO_2$ amplifiers and lasers, which output an amplified light beam at a wavelength of about 10600 nm, can present certain advantages as a drive laser for irradiating the target material in an LPP process. This may be especially true for certain target materials, for example, for materials containing tin. For example, one advantage is the ability to produce a relatively high conversion efficiency between the drive laser input power and the output EUV power.

In the EUV light source, EUV may be produced in a two-step process in which a droplet of target material en route to an irradiation site is first struck by a pre-pulse that conditions the droplet for subsequent phase conversion at the irradiation site. Conditioning in this context may include altering the shape of the droplet, e.g., flattening the droplet, or the distribution of the droplet, e.g., at least partially dispersing some of the droplet as a mist. For example, a pre-pulse hits the droplet to modify the distribution of the target material and a main pulse hits the target to transform it to an EUV-emitting plasma. In some systems the pre-pulse and the main pulse are provided by the same laser and in other systems the pre-pulse and the main pulse are provided by two separate lasers.

It is important to "target" the flying droplet to within a few micrometers for efficient and debris-minimized operation of the light source. In some systems the reflected light from the pre-pulse or the main pulse, either of which is an operational pulse as opposed to a pulse intended only to measure, i.e., a metrology pulse is analyzed. For example, U.S. Pat. No. 7,372,056, issued May 13, 2008 and titled "LPP EUV Plasma Source Material Target Delivery System," hereby incorporated herein in its entirety, discloses the use of a droplet detection radiation source and a droplet radiation detector that detects droplet detection radiation reflected from a droplet of target material.

U.S. Pat. No. 8,158,960, issued Apr. 17, 2012 and titled "Laser Produced Plasma EUV Light Source," hereby incorporated herein in its entirety, discloses the use of a droplet position detection system which may include one or more droplet imagers that provide an output indicative of the position of one or more droplets, e.g., relative to the irradiation region. The imager(s) may provide this output to a droplet position detection feedback system, which can, e.g., compute a droplet position and trajectory, from which a droplet error can be computed. The droplet error may then be provided as an input to a controller, which can, for example, provide a position, direction and/or timing correction signal to the system to control a source timing circuit and/or to control a beam position and shaping system, e.g., to change the location and/or focal power of the light pulses being delivered to the irradiation region.

U.S. Pat. No. 8,653,491, issued Feb. 18, 2014 and titled "System, Method and Apparatus For Aligning And Synchronizing Target Material For Optimum Extreme Ultraviolet Light Output," hereby incorporated herein in its entirety, discloses irradiating a first one of multiple portions of a target material with a drive laser and detecting light reflected from the first portion of the target material to determine a location of the first portion of the target material.

U.S. Pat. No. 9,241,395, issued Jan. 19, 2016 and titled "System and Method For Controlling Droplet Timing in an LPP EUV Light Source," hereby incorporated herein in its entirety, discloses a droplet illumination module that generates two laser curtains for detecting the droplets. A droplet detection module detects each droplet as it passes through the second curtain, determines when the source laser should generate a pulse so that the pulse arrives at the irradiation site at the same time as the droplet, and sends a signal to the source laser to fire at the correct time.

U.S. Pat. No. 9,497,840, issued Nov. 15, 2016 and titled "System and Method for Creating and Utilizing Dual Laser Curtains from a Single Laser in an LPP EUV Light Source," hereby incorporated herein in its entirety, discloses the use of two laser curtains and sensors that detect the position of the droplets of target material as they pass through the curtains.

Thus, in some systems, pre-pulse laser light or heating (vaporizing) laser light reflected from the droplet is used to locate the droplet in space by collecting the reflected light and imaging it on a sensor. Successful implementation of this system involves several technical challenges. For example, there is little or no reflection if the droplet is not already in the laser beam. Therefore the system works best only when it is effectively redundant in the sense that the laser is already hitting the droplet. Also, for some types of pre-pulse, there is little or no reflection even when the pre-pulse hits the droplet because the pre-pulse plasma efficiently absorbs it, so the signal-to-noise ratio may become too small for practical use. In addition, when the same pulse is used both to illuminate the droplet for the position measurement and to expand the target the position of the droplet can be determined only after the laser is fired so that there is no way to correct any error for that pulse.

In other systems a secondary light source in addition to the pre-pulse laser is used to illuminate the droplet, and a camera is positioned to image the illuminated droplet. This avoids at least some of the challenges described above but introduces the different challenge that the measurement determines the position of the droplet only relative to the camera and the secondary laser and not directly to the pre-pulse or heating laser beam itself. Therefore, additional steps are required to relate the reference frame of the measurement system and the reference frame of the pre-pulse or heating laser. In practice this can be quite difficult.

There is therefore a need for a droplet position detection system which avoids these challenges.

SUMMARY

The following presents a simplified summary of one or more embodiments in order to provide a basic understanding of the embodiments. This summary is not an extensive overview of all contemplated embodiments and is not intended to identify key or critical elements of all embodiments nor set limits on the scope of any or all embodiments. Its sole purpose is to present some concepts of one or more embodiments in a simplified form as a prelude to the more detailed description that is presented later.

According to one aspect of an embodiment there is disclosed a device and method for locating a droplet of target material in flight so that the droplet can be hit more accurately with a laser.

According to another aspect of an embodiment there is disclosed a device and method that combines the function of an independent light source with that of the pre-pulsing or heating laser by modulating the properties of the pre-pulsing or heating radiation source in time. This preserves the benefits of both systems described above while avoiding many of the disadvantages. For example, the use of a single light source instead of two separate light sources involves only a single coordinate reference frame instead of translation between two reference frames which must be calibrated and matched.

According to another aspect of an embodiment a hybrid light source can be configured to also emit a long pulse or quasi-CW radiation to illuminate the droplet so that the hybrid light source may be used to locate the droplet in addition to supplying a short pulse used to form the target. Quasi-continuous-wave (quasi-cw) operation of a laser means that its pump source is switched on only for certain time intervals, which are short enough to reduce thermal effects but still long enough that the laser process is close to its steady state, i.e., the laser is optically in a state of continuous-wave operation. The irradiance of the long pulse or quasi-CW radiation is set to be too low to ionize the droplet or target surface but sufficient to provide a good reflection signal for a longer period of time. Once the droplet is located using the long pulse or quasi-CW radiation, the remaining energy stored in the laser can be expended in a short pulse to pre-pulse the droplet and/or to convert target material in the droplet to a plasma.

According to another aspect of an embodiment the long weak pulse can be scanned until the return signal is maximized and then the short intense pulse can be steered and/or fired based on the maximum return signal to optimally hit the target.

According to another aspect of an embodiment, the focus of the long weak pulse may be modified so that the beamwidth is comparatively large during the position sensing, i.e., metrology period. This allows a much larger detection or "capture" volume for this position sensing system.

Further embodiments, features, and advantages of the subject matter of the present disclosure, as well as the structure and operation of the various embodiments are described in detail below with reference to accompanying drawings.

BRIEF DESCRIPTION OF THE DRAWING

FIG. 5B is a graph of irradiance as a function of time for emission from a hybrid light source system according to another aspect of an embodiment.

Figure 1:
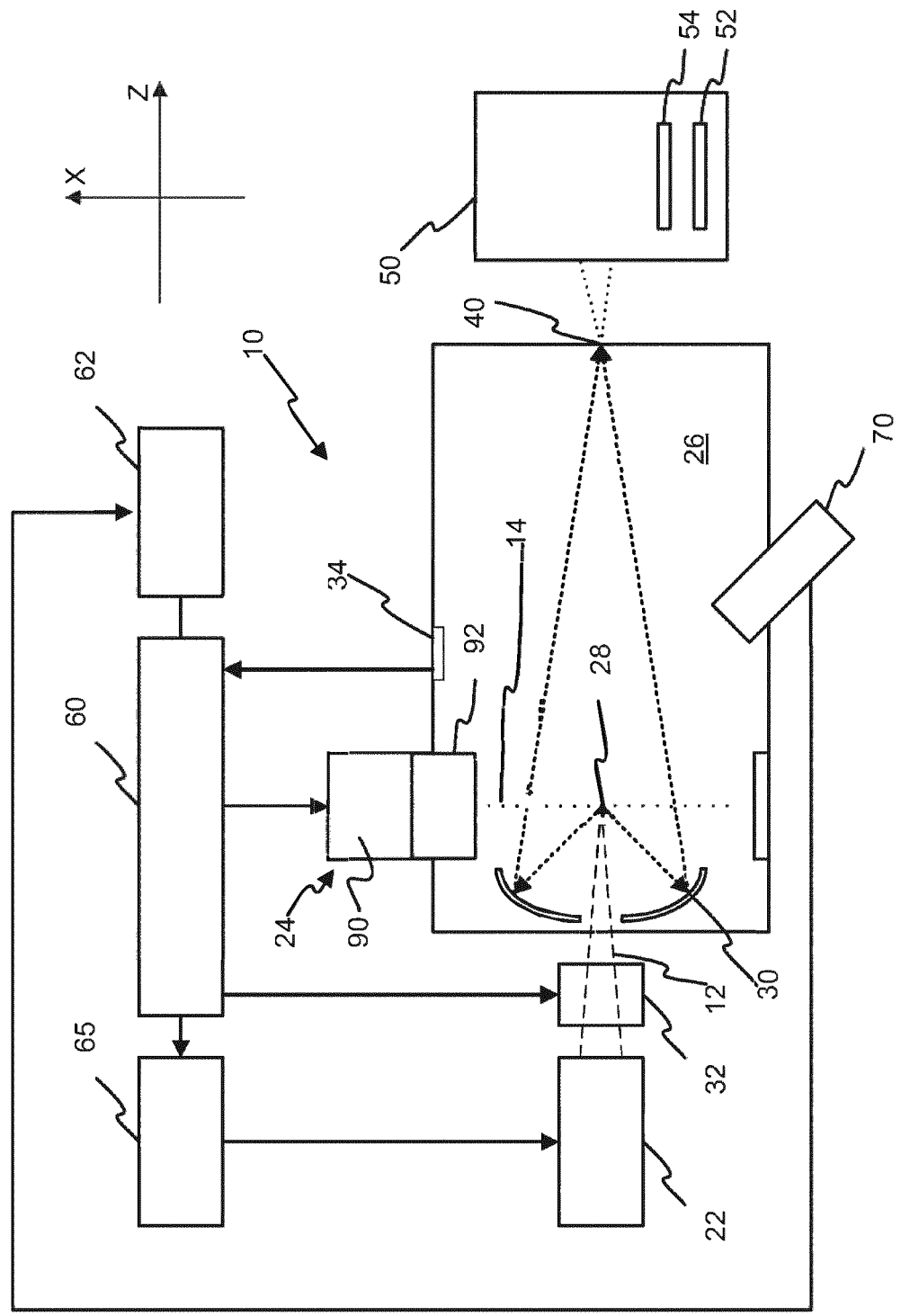
FIG. 1 is a schematic, not-to-scale view of an overall broad conception for a laser-produced plasma EUV radiation source system according to an aspect of the present invention.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below.

With initial reference to FIG. 1 there is shown a schematic view of an exemplary EUV radiation source, e.g., a laser produced plasma EUV radiation source 10 according to one aspect of an embodiment of the present invention. As shown, the EUV radiation source 10 may include a pulsed or continuous laser source 22, which may for example be a pulsed gas discharge $CO_2$ laser source producing a beam 12 of radiation at a wavelength generally below 20 μm, for example, in the range of about 10.6 μm to about 0.5 μm or less. The pulsed gas discharge $CO_2$ laser source may have DC or RF excitation operating at high power and at a high pulse repetition rate.

The EUV radiation source 10 also includes a target delivery system 24 for delivering target material in the form of liquid droplets or a continuous liquid stream. In this example, the target material is a liquid, but it could also be a solid or gas. The target material may be made up of tin or a tin compound, although other materials could be used. In the system depicted the target material delivery system 24 introduces droplets 14 of the target material into the interior of a vacuum chamber 26 to an irradiation region 28 where the target material may be irradiated to produce plasma. In some cases, an electrical charge is placed on the target material to permit the target material to be steered toward or away from the irradiation region 28. It should be noted that as used herein an irradiation region is a region where target material irradiation may occur, and is an irradiation region even at times when no irradiation is actually occurring. The EUV light source may also include a beam focusing and steering system 32 as will be explained in more detail below in conjunction with FIG. 2.

In the system shown, the components are arranged so that the droplets 14 travel substantially horizontally. The direction from the laser source 22 towards the irradiation region 28, that is, the nominal direction of propagation of the beam 12, may be taken as the Z axis. The path the droplets 14 take from the target material delivery system 24 to the irradiation region 28 may be taken as the X axis. The view of FIG. 1 is thus normal to the XZ plane. Also, while a system in which the droplets 14 travel substantially horizontally is depicted, it will be understood by one having ordinary skill in the art the other arrangements can be used in which the droplets travel vertically or at some angle with respect to gravity between and including 90 degrees (horizontal) and 0 degrees (vertical).

The EUV radiation source 10 may also include an EUV light source controller system 60, which may also include a laser firing control system 65, along with the beam steering system 32. The EUV radiation source 10 may also include a detector such as a target position detection system which may include one or more droplet imagers 70 that generate an output indicative of the absolute or relative position of a target droplet, e.g., relative to the irradiation region 28, and provide this output to a target position detection feedback system 62.

The target position detection feedback system 62 may use the output of the droplet imager 70 to compute a target position and trajectory, from which a target error can be computed. The target error can be computed on a droplet-by-droplet basis, or on average, or on some other basis. The target error may then be provided as an input to the light source controller 60. In response, the light source controller 60 can generate a control signal such as a laser position, direction, or timing correction signal and provide this control signal to the laser beam steering system 32. The laser beam laser beam steering system 32 can use the control signal to change the location and/or focal power of the laser beam focal spot within the chamber 26. The laser beam steering system 32 can also use the control signal to change the geometry of the interaction of the beam 12 and the droplet 14. For example, the beam 12 can be made to strike the droplet 14 off-center or at an angle of incidence other than directly head-on.

As shown in FIG. 1, the target material delivery system 24 may include a target delivery control system 90. The target delivery control system 90 is operable in response to a signal, for example, the target error described above, or some quantity derived from the target error provided by the system controller 60, to adjust paths of the target droplets 14 through the irradiation region 28. This may be accomplished, for example, by repositioning the point at which a target delivery mechanism 92 releases the target droplets 14. The droplet release point may be repositioned, for example, by tilting the target delivery mechanism 92 or by shifting the target delivery mechanism 92. The target delivery mechanism 92 extends into the chamber 26 and is preferably externally supplied with target material and a gas source to place the target material in the target delivery mechanism 92 under pressure.

Continuing with FIG. 1, the radiation source 10 may also include one or more optical elements. In the following discussion, a collector 30 is used as an example of such an optical element, but the discussion applies to other optical elements as well. The collector 30 may be a normal incidence reflector, for example, implemented as an MLM with additional thin barrier layers, for example $B_4C$, ZrC, $Si_3N_4$ or C, deposited at each interface to effectively block thermally-induced interlayer diffusion. Other substrate materials, such as aluminum (Al) or silicon (Si), can also be used. The collector 30 may be in the form of a prolate ellipsoid, with a central aperture to allow the laser radiation 12 to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EUV radiation may be output from the EUV radiation source 10 and input to, e.g., an integrated circuit lithography scanner or stepper 50 which uses the radiation, for example, to process a silicon wafer workpiece 52 in a known manner using a reticle or mask 54. The silicon wafer workpiece 52 is then additionally processed in a known manner to obtain an integrated circuit device.

The arrangement of FIG. 1 also includes a temperature sensor 34, e.g., a thermocouple positioned within the chamber 26 to measure the local temperature, i.e., temperature at the sensor, of the gas within the chamber 26. FIG. 1 shows one temperature sensor but it will be apparent that additional temperature sensors may be used. The temperature sensor 34 generates a signal indicative of the measured temperature and supplies it as an additional input to the controller 60. The controller 60 bases the control signal it supplies to the beam steering system 32 at least in part on this temperature signal.

Figure 2:
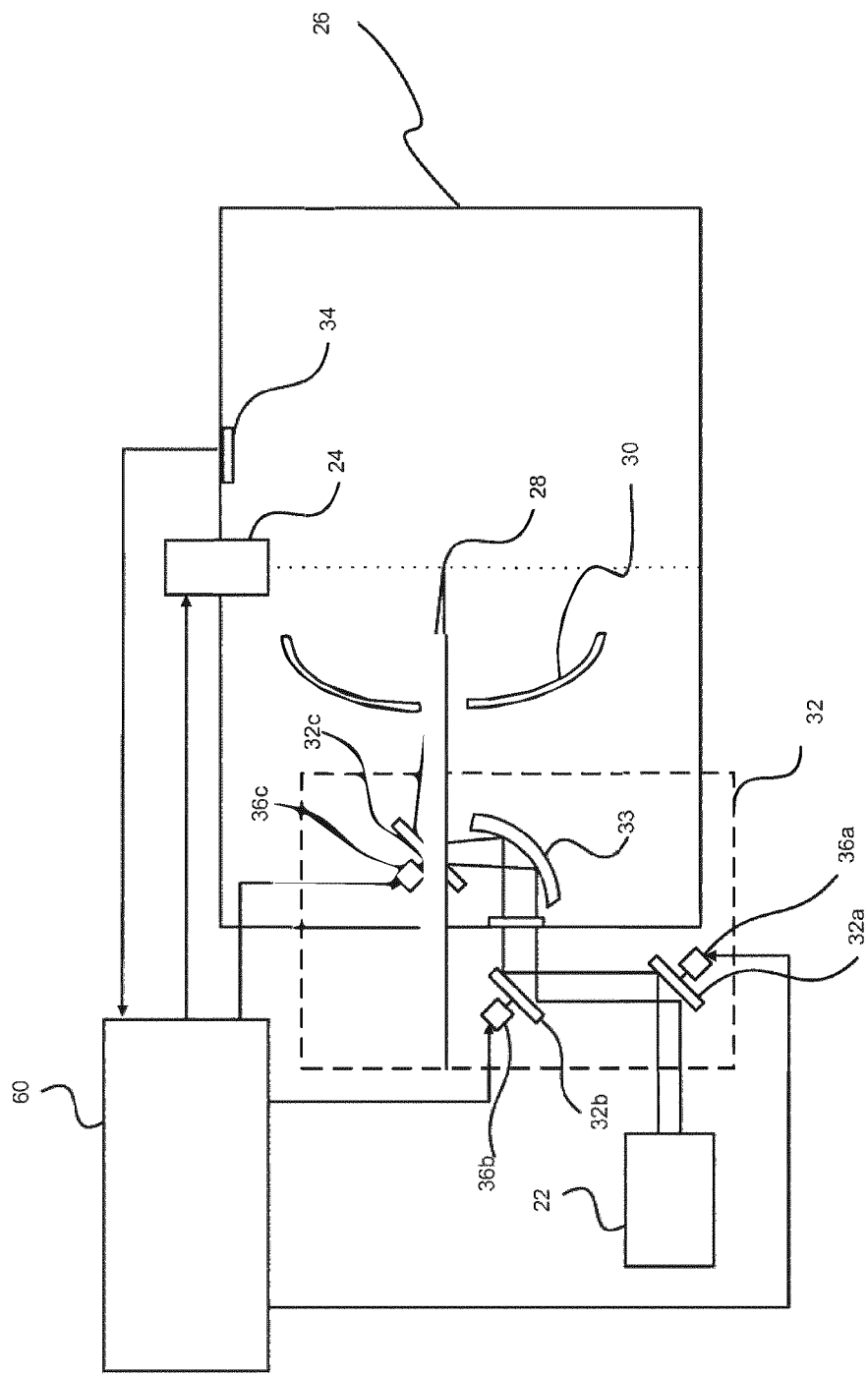
FIG. 2 is a schematic, not-to-scale view of a portion of the system of FIG. 1.

Continuing to FIG. 2, it can be seen that the beam steering system 32 may include one or more steering mirrors 32a, 32b, and 32c. Although three mirrors are shown, it is to be appreciated that more than three or as few as one steering mirror may be employed to steer the beam. Moreover, although mirrors are shown, it is to be appreciated that other optics such as prisms may be used and that one or more of the steering optics may be positioned inside the chamber 26 and exposed to plasma-generated debris. See for example U.S. Pat. No. 7,598,509 issued Oct. 6, 2009, and titled "Laser Produced Plasma EUV Light Source," the entire contents of which are hereby incorporated by reference herein. For the embodiment shown, each of the steering mirrors 32a, 32b, and 32c may be mounted on a respective tip-tilt actuator 36a, 36b, and 36c which may move each of the steering mirrors 32a, 32b, and 32c independently in either or both of two dimensions.

Figure 3A:
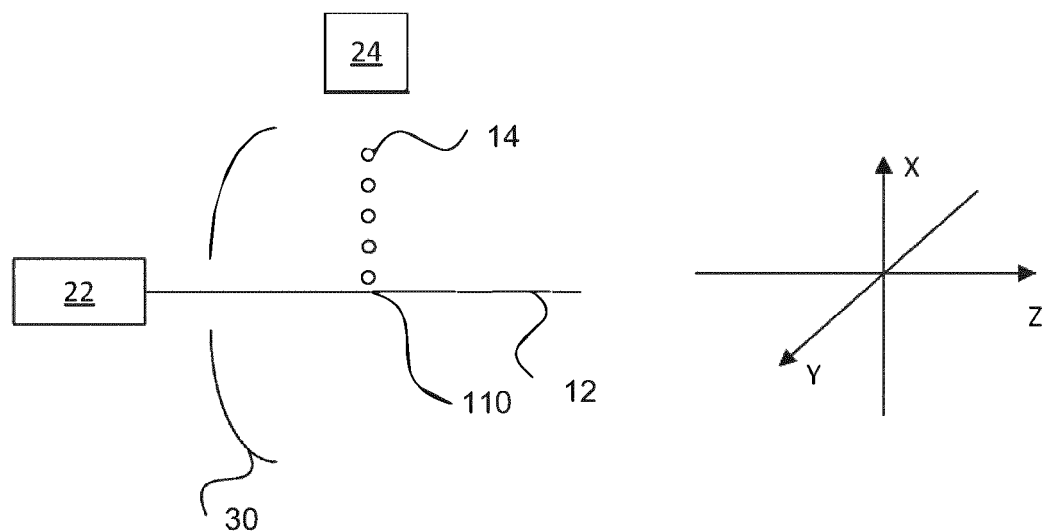
FIGS. 3A and 3B are diagrams illustrating certain targeting principles in a system such as that shown in FIGS. 1 and 2.

As mentioned, in general, for a reference coordinate system, as shown in FIG. 3A, Z is the direction along which the laser beam 12 propagates and is also the direction from the collector 30 to the irradiation site 110 and the EUV intermediate focus. X is in the droplet propagation plane. Y is orthogonal to the XZ plane. To make this a right-handed coordinate system, the trajectory of the droplets 14 is taken to be in the −X direction.

Figure 3B:
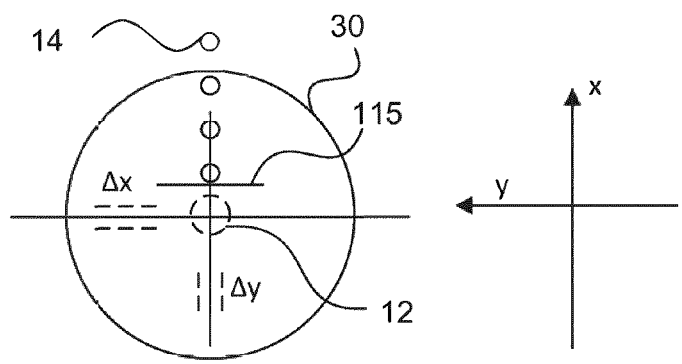

The primary components of targeting error are ΔX and ΔY as shown in FIG. 3B. These errors typically need to be kept to less than about 5 μm. Errors in the Z-direction are less critical because the Rayleigh length of the laser focus is relatively long, so 100 μm or worse is tolerable.

The X position error ΔX is mostly a consequence of timing error, that is, timing of laser firing, assuming constant droplet velocity. Timing error correction can be accomplished fairly well by detecting the time at which the droplet crosses a laser curtain 115 near the irradiation site 110 within the irradiation region. This measurement can be made even when the laser is operational because the laser curtain 115 is provided by a separate laser source and so can always be on. Also, the measurement performed using the laser curtain 115 is relatively tolerant to misalignment in Y,Z because the curtain is made to be wide in the YZ plane. There remains a need, however, for improvement in determining ΔX.

Determining the Y error ΔY is more challenging. It is possible to use the reflection of a pre-pulse of the beam 12 from the droplet 14 for all of the needed Y correction and some of the needed X correction. In principle, to measure the droplet Y position it is possible use a separate illuminator like the laser curtain 115 used for the arrival time. This would require the use of a high frame-rate imaging 2D detector (camera) to resolve the position, whereas the arrival timing needs only a non-imaging scattered light detector. There is thus also a need for improvement in determining ΔY.

An improved system would increase the capture range in space, i.e. "see" the droplet/target when the operational pulse is very much misaligned to the droplet/target. In particular this is a problem in Y because the independent X timing system already ensures that relatively small misalignments along that direction. It would also make it possible to acquire foreknowledge of the droplet's position in space at a certain time before the next laser pulse is fired, allowing anticipation of an error in X and correction of that error by adjusting timing that next pulse. This correction might also be made for Y although in general correction of Y requires moving at least one steering mirror which is slower than changing the time delay. An improved system would also make use of a single laser for the operational pulse(s) as well as for the metrology pulse. An improved system would also provide an option for set-up, i.e., "offline" targeting. This offers the advantage that the metrology pulse does not significantly disturb the droplet and so does not generate debris. If, for example, a pre-pulse was used to locate the droplet at the pre-pulse focus, it would generate too much debris to be used in a source that has a collector mirror installed.

Figure 4:
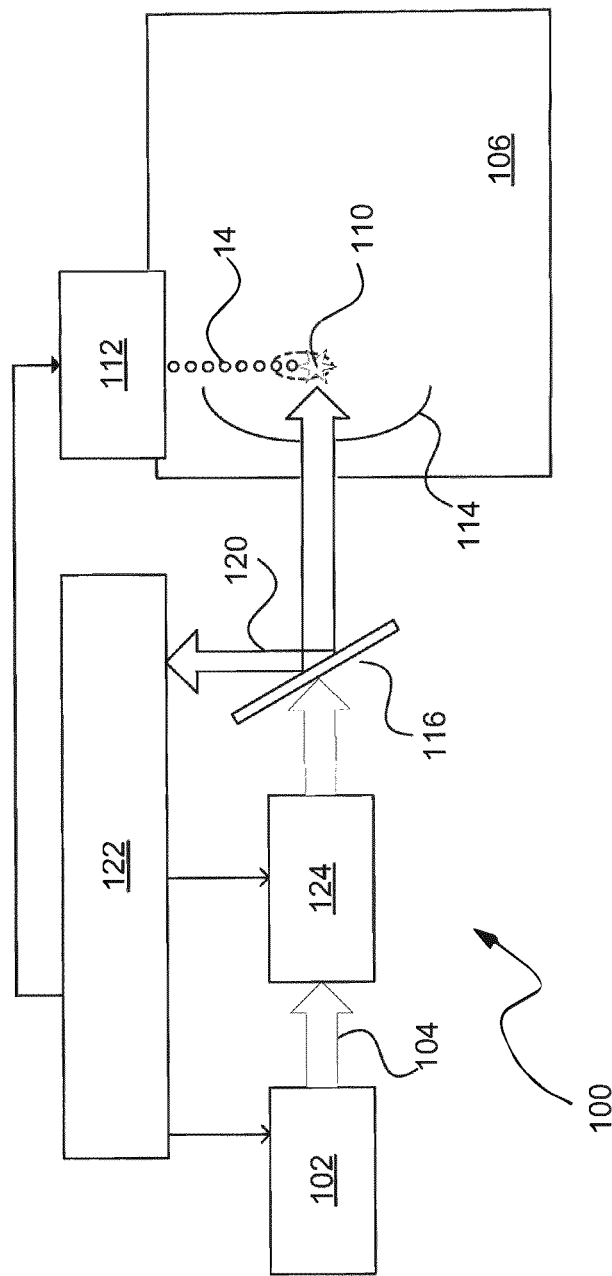
FIG. 4 is a not-to-scale schematic diagram of an EUV system according to one aspect of an embodiment.

FIG. 4 is a not-to-scale schematic diagram of an EUV system 100 according to one aspect of an embodiment. EUV system 100 includes, among other features, a radiation source 102 capable of producing a radiation beam 104. The radiation beam 104 propagates into a chamber 106 where it strikes a quantity of target material 14 at an irradiation site 110 in an irradiation region 28.

In the example shown, the target material 14 is originally in the form of a stream of droplets released by a target material dispenser 112, which in the example is a droplet generator. The target material droplet 14 can be ionized by a main pulse in this form. Alternatively, the target material 14 can be preconditioned for ionization with a pre-pulse that can, for example, change the geometric distribution of the target material 14. Thus it may be necessary both to hit the target material 14 accurately with the pre-pulse to ensure the target material 14 is in the desired form (disk, cloud, etc.), and to hit the target accurately with the main pulse to promote efficient production of EUV radiation. Herein, either of the pre-pulse or the main pulse is referred to as operational radiation because they predominantly induce changes in the form and/or physical state of the target material 14.

As used herein, the term "irradiation site" is used to connote the position 110 in the chamber 106 where the target material 14 is struck with a heating pulse. It may coincide with the primary focus of a collector mirror 114. The term "irradiation region" is used herein to mean the region 28 or 118 which includes the irradiation site 110 and also the region where the target material is irradiated by a pre-pulse (pre-pulse focus) and/or a metrology pulse, i.e., a region the target material 14 encounters before it reaches the irradiation site 110 and which can also be irradiated by the radiation source 102.

The system of FIG. 4 also includes an optical module 124. This optical module, which includes the beam steering system and may be part of other system optics, can focus and steer the radiation beam 104 under the control of a control module 122. As will be described more fully below, the control module 122 can use the reflected metrology radiation to detect a position of the target material 14.

According to an aspect of an embodiment, the radiation source 102 is configured as a hybrid light source that emits not only the operational radiation but also metrology radiation. As described more fully below, this can be achieved, for example, by using a laser adapted to generate radiation of varying power, one level for metrology and another for operation, in a temporally divided scheme. Or, this can be achieved, as an example, the use of optics which attenuate the beam at certain times (temporal division) or separate a laser beam into beams of different power that propagate at least partially along different paths (spatially divided). The term "metrology radiation" is used herein to refer to radiation predominantly used to determine the position of the target material 14 and which has an irradiance or fluence below a value which would significantly perturb the target material. "Significantly perturb" means that the metrology radiation does not cause the droplet to undergo a change in physical state or geometric distribution, for example, does not ablate the droplet, ionize the droplet, flatten the droplet, disperse the droplet, or cause the target material in the droplet to boil. The metrology radiation is used to find the target material 14 before the target material 14 reaches the position where it will be irradiated by the operational radiation. Finding the position of the target material enables the system to determine optimal steering of the operational radiation.

Figure 5A:
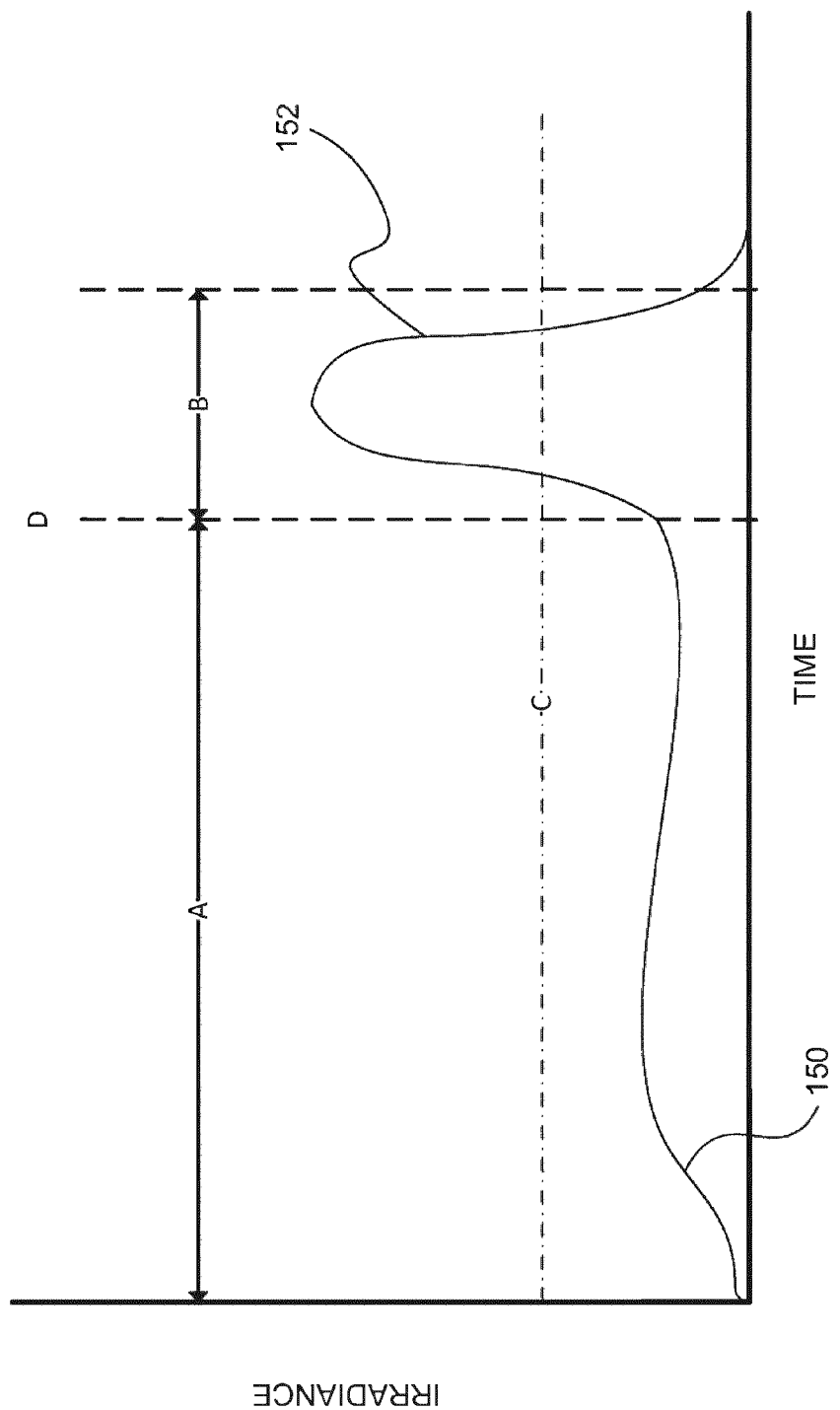
FIG. 5A is a graph of irradiance as a function of time for emission from a hybrid light source system according to one aspect of an embodiment.

With reference to FIG. 5A, in a temporally divided arrangement, the metrology radiation 150 may be a long pulse (compared to the duration of the operational radiation 152) or quasi-CW radiation to illuminate the target material 14. The metrology radiation 150 can be essentially continuous as shown in FIG. 5A or can be one or more pulses as shown in FIG. 5B. Pulsed metrology radiation is especially practical with certain kinds of laser sources, e.g., lasers comprising an oscillator emitting a train of pulses at about 100 MHz. If interval A is 10 μs in duration, 1000 weak oscillator pulses could be scattered from the droplet during interval A and integrated on, for example, a camera. Then the laser could emit an amplified pulse as the 1001st oscillator pulse to produce the strong pulse 152 for operational purposes, e.g. as a pre-pulse to form the target.

In the example shown, the metrology radiation 150 has duration A and the operational radiation 152 has duration B. During the interval A the droplet is assessed by metrology radiation 150. When the system is being used to perform an offline setup of the alignment of the system, as during an initial phase or during maintenance, duration A continues at least until the system has determined the location of the target material 14 and then, with the proper steering based on the determined location, the radiation source 102 emits the shorter operational radiation 152 to ionize the surface and pre-pulse the target material 14 and/or to heat the target material 14 to a plasma. When the system is being used to maintain proper steering when the source is online, the detection accomplished in interval A is used to correct steering on the fly, but the system does not necessarily wait until proper steering is achieved before irradiating the target material with operational radiation.

If the metrology radiation 150 is essentially continuous then its magnitude should be maintained below the level C. The duration of the metrology interval A and the magnitude of level C are chosen so that the droplet 14 is not significantly perturbed during the metrology interval A. This is both a function of the instantaneous magnitude of the metrology radiation applied during interval A and the duration of interval A. Essentially, the integral of the energy coupled into the droplet 14 over time should not exceed a predetermined amount that would significantly perturb the droplet 14. The level C also should not exceed an instantaneous ablation threshold. Also, for pulsed metrology radiation, the pulses should not cumulatively couple enough energy into the droplet 14 to cause the target material to come near to its boiling temperature, so that the magnitude of the pulses and the duration of the interval A are interdependent.

In other words, for the case of essentially continuous metrology radiation 150 the level C is chosen so that it is below an amount that would couple sufficient energy into the droplet 14 over interval A to significantly perturb it. For the case of pulsed metrology radiation 150 the magnitude of an individual pulse may exceed level C but will be below a level D again chosen so that the cumulative amount of energy the pulses couple into the droplet 14 over interval A is not enough to significantly perturb it. In either case, as is implicit in the above, the energy coupled into the droplet 14 should not at any time exceed the amount needed to perturb it instantly.

The duration A can be chosen and then C can be selected. For example, it is generally desirable to be able to locate the position of the droplet to within micrometers, e.g., in a range of about 1 μm to about 5 μm. The speed of the droplet along the direction transverse to its direction of flight, for example, in the Y direction, is of the order of about 0.2 m/s, so the longest interval A that will not smear out an image of the droplet 14 is of the order of about 5 μm/0.2 m/s and so about 25 microseconds. As regards continuous versus pulsed metrology radiation, if the laser has a repetition rate of about 50 kHz or greater (that is, a period of about 20 microseconds or shorter), and the duration of interval A is about the same, then the metrology radiation in interval A would be essentially continuous. Thus, the duration of interval A may be in the range of about 100 ns to 20 μs. At the upper end of this range, that is, near about 20 μs, the metrology radiation would be essentially continuous.

The delay between determination of the position of the target material and irradiating the droplet with operational radiation should be as short as possible, for example, on the order of about 1 μs. As an upper limit, it is beneficial if the delay does not exceed the duration of one pulse (one shot) behind the pulse repetition cycle of the plasma which is on the order of about 20 μs.

The hybrid laser that can produce two different power levels can be constructed, for example, as a laser with a leaky Q-switch. Q switching is a technique for obtaining energetic short pulses from a laser by modulating the intracavity losses by putting a variable attenuator, a Q-switch, inside the laser optical resonator, thus altering the Q factor of the laser resonator. The intracavity losses can be set so the power of the radiation from the laser can be controlled.

The hybrid laser can also be constructed, for example, as a seed oscillator with one or more amplifiers analogously to the manner in which lasers used for double-pulse particle image velocimetry are constructed.

The ablation threshold is expressed in terms of the radiant exposure or fluence ($J/cm^2$), i.e., the radiant energy received by a surface per unit area, which is on the order of 1 $J/cm^2$ for nanosecond pulses, rather than the irradiance ($W/cm^2$) which is the radiant energy received by a surface per unit time per unit area. The operational pre-pulse 152 has a fluence of about 10 $J/cm^2$ to about 1000 $J/cm^2$ depending on the wavelength which may range, for example, from about 532 nm to 10600 nm and with a duration ranging, for example, from about 1 ps to about 100 ns. The operational heating pulse is better specified in terms of irradiance and is typically in the range, for example, of about 8 $GW/cm^2$ to about 15 $GW/cm^2$ for a 10600 nm wavelength and durations of about 10 ns to about 100 ns.

Referring again to FIG. 4, light from the metrology radiation 150 is reflected by the target material 14 while the target material 14 is en route to the prime irradiation site 110. A beam splitter 116 redirects the reflected light 120 to a control module 122 which uses the redirected reflected light 120 to determine the position of the target material 14. The control module 122 uses the determined position to supply a control signal to the radiation source 102 that causes the radiation source 102 to switch from emitting the metrology radiation 150 to emitting operational radiation 152. Or, the radiation source may automatically switch from emitting the metrology radiation 150 to emitting an operation radiation 152 after a preset amount of time (A). The control module 122 also uses the reflected metrology radiation 120 to control the optical module 124 to steer the radiation beam 104.

According to another aspect of an embodiment the control module 122 can scan the reflected metrology radiation 120 until the return signal is maximized and then the control module 122 can cause the radiation source 102 to emit a short intense pulse of operational radiation at the maximum return signal to optimally hit the target material 14.

According to another aspect of an embodiment, the optical module 124 can change the focus and/or direction of radiation beam 104 during emission of the metrology radiation 150 so that the beamwidth of the radiation beam 104 is larger during emission of the metrology radiation 150. For example, during the interval A the average power may be selected to be less than about one tenth of the magnitude of C and during the interval B the average power may be selected to be about ten times C. This results in an irradiance during interval B that is about one hundred times greater that the irradiance during interval A. In the example where the radiation source 102 is essentially CW, the area of the beam must change by about one hundred times from interval A to interval B and therefore the beamwidth should change by a factor of about ten. As an example, during the metrology phase A the beamwidth would then be around 1 mm, and during the operational phase B the beamwidth would be around 100 µm. The optical module 124 can be part of the overall optical system for the light source.

The systems described above may be used according to one aspect of an embodiment for setup or alignment in which an operational pulse is not fired until proper alignment is obtained. Once proper alignment is achieved, they can be used to maintain targeting accuracy for the remaining duration of operation. Also, while the source is operating, it is typically necessary to fire on every cycle even if targeting has deviated from optimal. In other words, even though the conditions for optimal targeting may no longer hold the laser must still be fired. Thus, it may not be possible to correct steering for the most immediately next pulse, but steering can be corrected for subsequent pulses.

Figure 6:
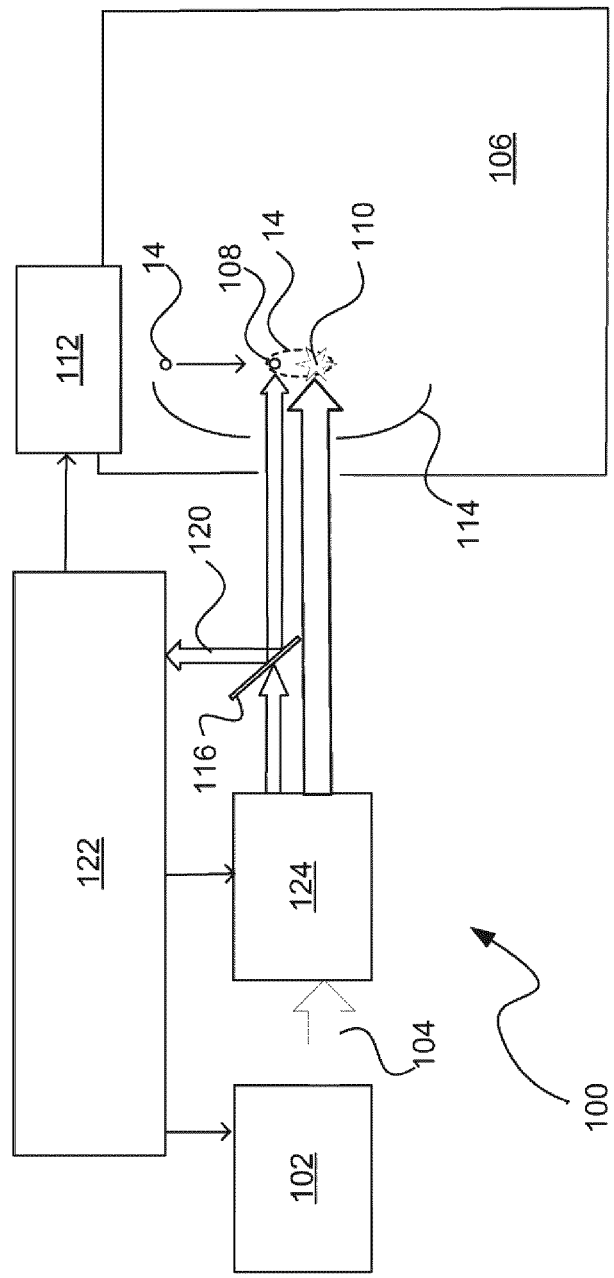
FIG. 6 is a not-to-scale schematic diagram of an EUV system according to another aspect of an embodiment.

The optical module 124 may also or alternatively be configured to switch or split the beam 104 between two paths as shown in FIG. 6 in a spatially divided arrangement. Also, the optical module 124 can be configured to provide different beam widths or spot sizes for the two beams near the irradiation region 118. The optical module 124 can be, for example, an electro-optic device that switches polarization between states to select a path on a polarizing beam splitter with different optics in the two paths. The different optics modify the near-field or far-field image of the radiation source 102 so that the beamwidth in the plane of the target material 14 is substantially different for the two paths, e.g. resulting in an irradiance or fluence below the level C of FIG. 5A for one path and an irradiance or fluence alternately above the level C of FIG. 5A for the other path. This allows a much larger detection or "capture" volume for this position sensing system. In this embodiment, the radiation source 102 and the optical module 124 can together be considered a hybrid laser. The metrology radiation and the operational radiation may be generated concurrently but separated in space or generated sequentially and be separated in space, i.e., separated in space and time. This is as opposed to the metrology radiation and the operational radiation being generated sequentially.

Figure 7:
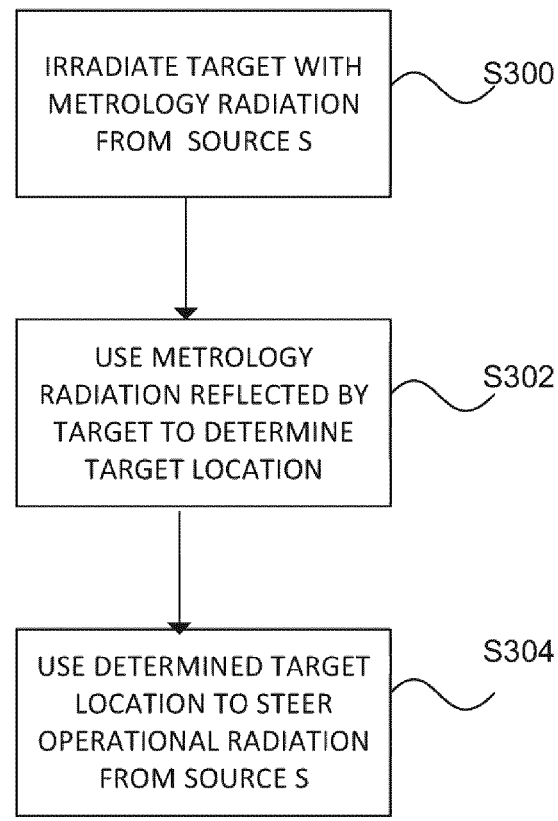
FIG. 7 is a flow chart showing a mode of operation of an EUV system according to aspects of an embodiment.

With reference to FIG. 7 there is disclosed a method of using a hybrid radiation source to determine the position of target material according to an aspect of an embodiment. In a step S300 a radiation source S is operated to irradiate target material with metrology radiation. This can be before the generation of operational radiation in an alignment mode or concurrently with the generation of operational radiation in an in-line targeting maintenance mode. In a step S302 a reflected portion of the metrology radiation is used to locate the target material. Once the position of the target material is determined then in a step S304 the determined location is used to steer operational radiation from the source S to strike the target material most accurately.

Figure 8:
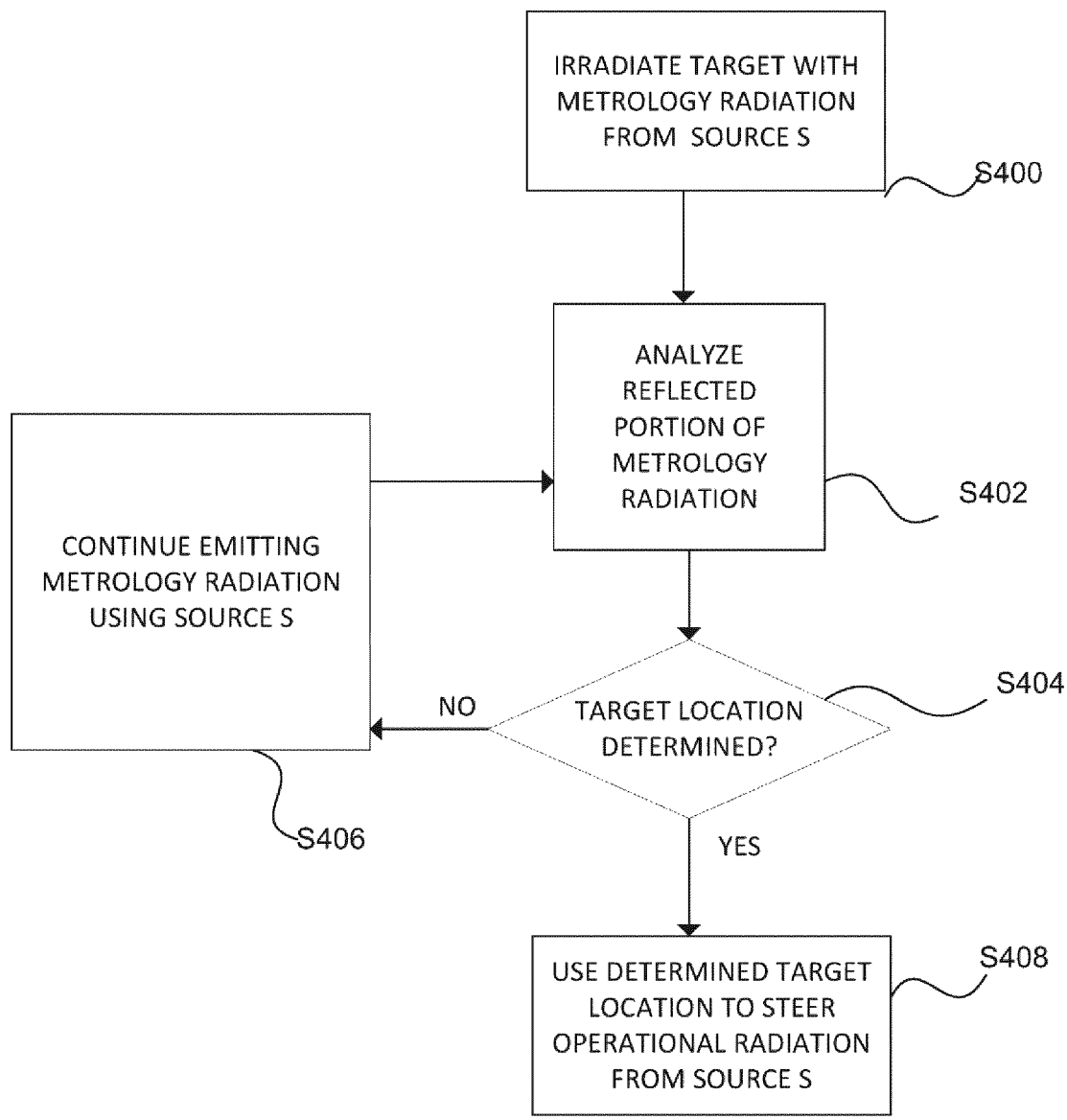
FIG. 8 is a flow chart showing a mode of operation of an EUV system according to aspects of an embodiment.

With reference to FIG. 8 there is disclosed a method of using a hybrid radiation source to determine the position of target material according to another aspect of an embodiment. In a step S400 a radiation source S is operated to irradiate target material with metrology radiation. This can be before the generation of operational radiation in an alignment mode or concurrently with the generation of operational radiation in an in-line targeting maintenance mode. In a step S402 a reflected portion of the metrology radiation is analyzed to determine the position of the target material by determining, for example, the presence or absence of any reflected metrology radiation or the magnitude of the reflected portion of the metrology signal exceeding a predetermined value or reaching a predetermined value or reaching its maximum value. In a step S404 it is decided (for example by the control module 122 based on the reflected portion 120 of the metrology radiation) whether the position of the target material has been determined. If not then in a step S406 the source S continues to emit the metrology radiation. If the decision in step S404 is affirmative then in a step S408 the determined location is used to steer operational radiation from the source S to strike the target material most accurately.

Figure 9:
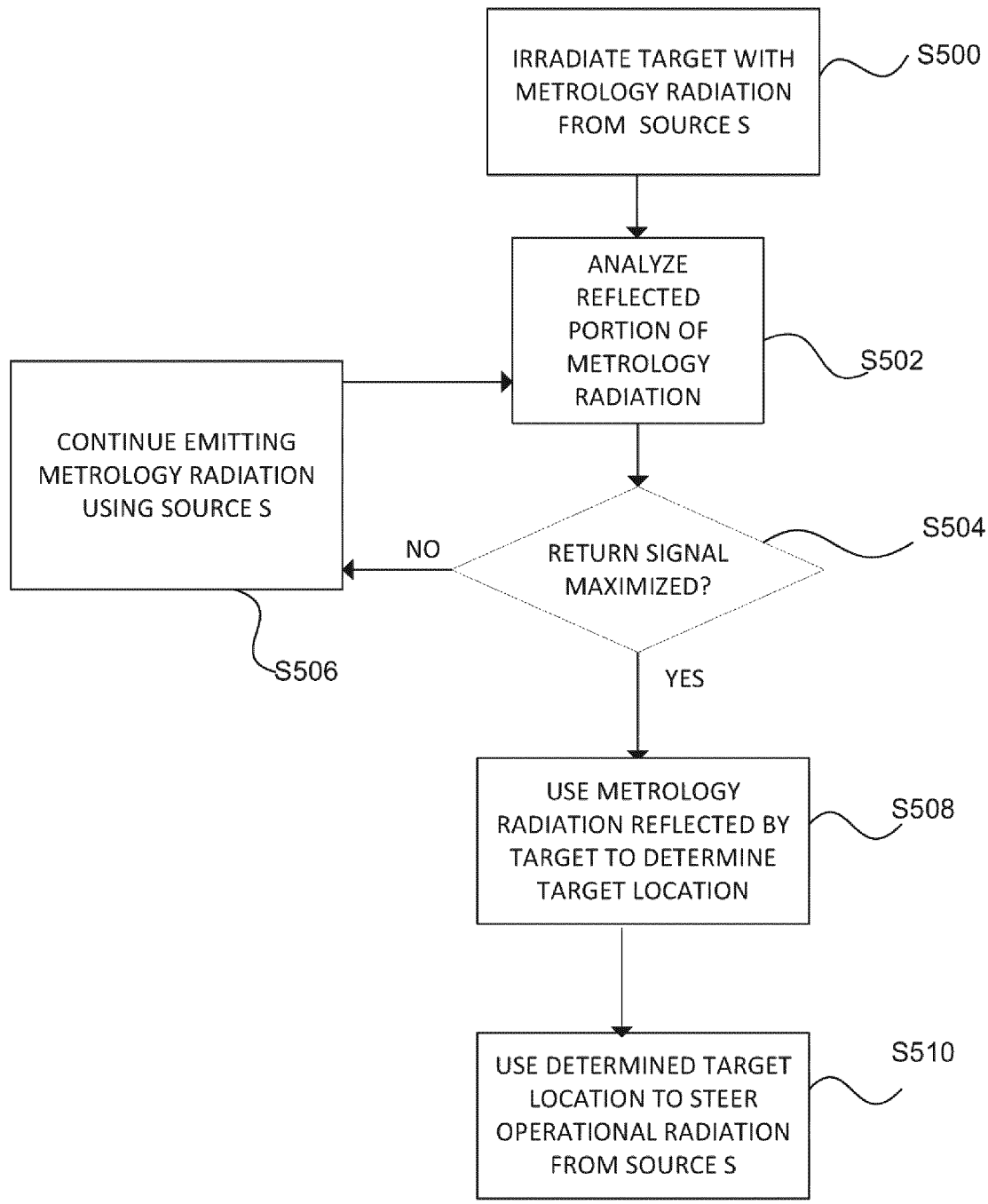
FIG. 9 is a flow chart showing a mode of operation of an EUV system according to aspects of an embodiment.

FIG. 9 is a flow chart depicting a method of using a hybrid radiation source to determine the position of target material according to another aspect of an embodiment. In a step S500 a radiation source S is operated to irradiate target material with metrology radiation. This can be before the generation of operational radiation in an alignment mode or concurrently with the generation of operational radiation in an in-line targeting maintenance mode. In a step S504 it is decided (for example by the control module 122) whether a signal based on the magnitude of the reflected metrology radiation has reached a predetermined, e.g., maximum value. If not then in a step S506 the source S continues to emit the metrology radiation. If the decision in step S504 is affirmative then in a step S508 the determined location is used to steer operational radiation from the source S to strike the target material most accurately.

Figure 10:
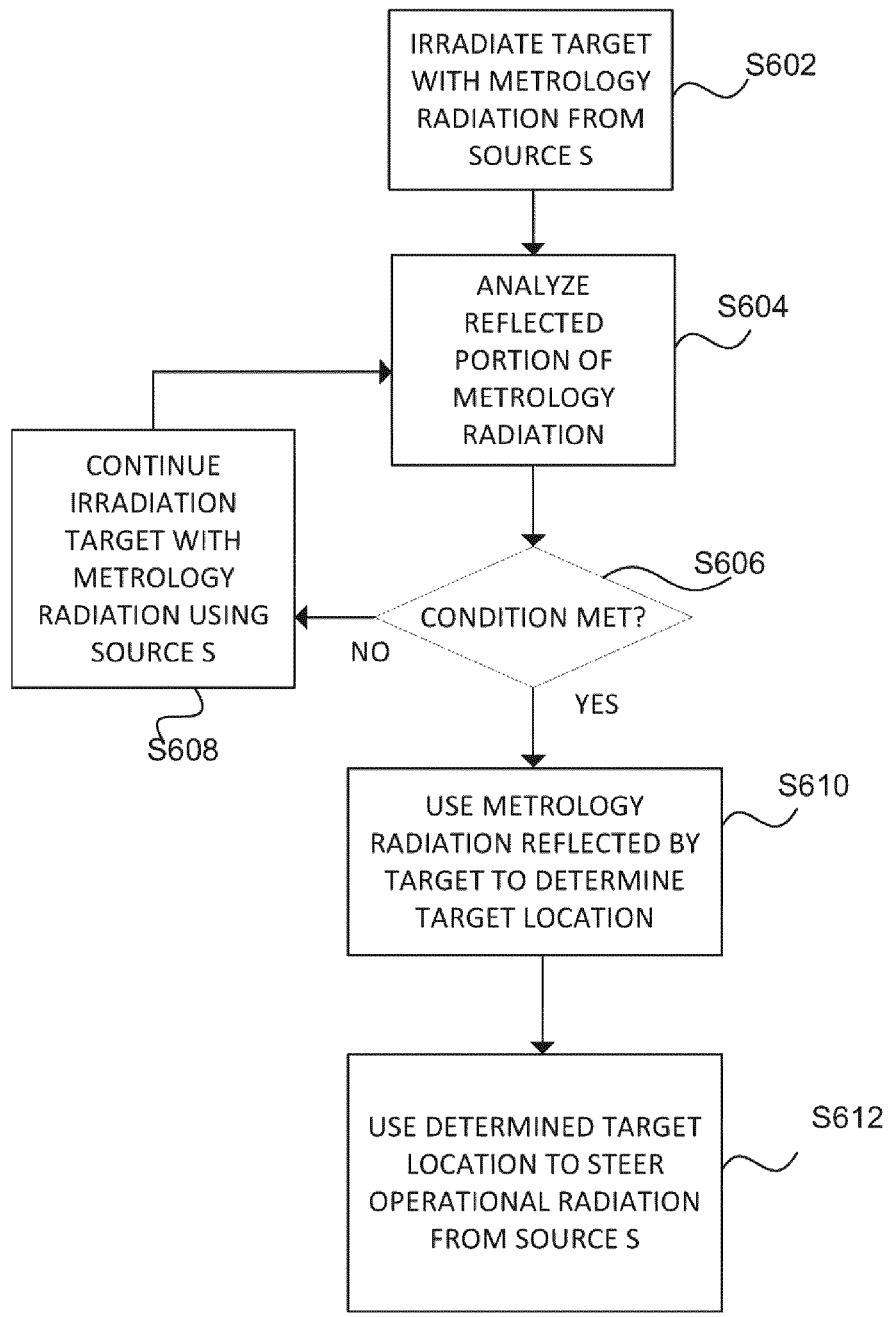
FIG. 10 is a flow chart showing a mode of operation of an EUV system according to aspects of an embodiment.

FIG. 10 is a flow chart depicting a method of using a hybrid radiation source to determine the position of target material according to another aspect of an embodiment. In a step S602 In a step S500 a radiation source S is operated to irradiate target material with metrology radiation. This can be before the generation of operational radiation in an alignment mode or concurrently with the generation of operational radiation in an in-line targeting maintenance mode. In a step S604 a reflected portion of the metrology radiation is analyzed for a given condition that will indicate the position of the target material, for example, the presence or absence of any reflected metrology radiation or the magnitude of the reflected portion of the metrology signal exceeding a predetermined value or reaching a predetermined value or reaching its maximum value. In a step S606 it is determined whether the analysis indicates that the given condition has been met. If not then in a step S608 the source S continues to emit the metrology radiation. If the decision in step S606 is affirmative then in a step S610 the control module 122 uses the reflected to determine a target location. Then in a step S612 the determined location is used to steer operational radiation from the source S to strike the target material most accurately.

As mentioned above, in cases where the hybrid laser emits the metrology radiation and the operational radiation sequentially rather than concurrently, the optical module 124 can be configured to cause the metrology radiation to have a beamwidth that is wider than the beamwidth of the operational radiation.

The present disclosure is made the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. For example, the control module functions can be divided among several systems or performed at least in part by an overall control system.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

Other aspects of the invention are set out in the following numbered clauses.

1. Apparatus comprising:
   a laser system configured to generate metrology radiation and operational radiation from a single laser source;
   a first optical system arranged to convey the metrology radiation along a first optical path to an irradiation region;
   a second optical system arranged to convey reflected metrology radiation reflected by target material in the irradiation region;
   metrology module arranged to receive the reflected metrology radiation and configured to perform an analysis of the reflected metrology radiation and to generate a control signal based at least in part on the analysis; and
   a steering module arranged to receive the control signal and configured to steer the operational radiation in response to the control signal, the first optical system conveying the operational radiation to an irradiation site in the irradiation region.

2. Apparatus as in clause 1 wherein the laser system is further configured to generate only one of the metrology radiation and the operational radiation at a given time.

3. Apparatus as in clause 1 wherein the laser system is further configured to generate the metrology radiation and the operational radiation from an initial radiation from the single laser source.

4. Apparatus as in clause 3 wherein the laser system is further configured to divide the initial radiation into the metrology radiation and the operational radiation.

5. Apparatus as in clause 1 wherein the control module generates the control signal a predetermined time after the control module determines that the reflected metrology radiation satisfies a predetermined criterion.

6. Apparatus as in clause 5 wherein the predetermined criterion is a detected presence of the reflected metrology radiation.

7. Apparatus as in clause 5 wherein the predetermined criterion is a magnitude of the reflected metrology radiation exceeding a predetermined threshold.

8. Apparatus as in clause 5 wherein the predetermined criterion is a timing of the reflected metrology radiation.

9. Apparatus as in clause 5 wherein the predetermined criterion is the reflected metrology radiation achieving a maximum value.

10. Apparatus as in clause 5 wherein the predetermined time is immediately after the control module determines that the reflected metrology radiation satisfies the predetermined criterion.

11. Apparatus as in clause 1 wherein the metrology radiation has an irradiance below a value capable of significantly perturbing the target material.

12. Apparatus as in clause 1 wherein the first optical system and the second optical system share at least one optical element.

13. Apparatus as in clause 1 wherein the metrology radiation is a metrology pulse.

14. Apparatus as in clause 1 wherein the metrology radiation is quasi-CW laser radiation.

15. Apparatus as in clause 1 wherein the operational radiation comprises a pre-pulse.

16. Apparatus as in clause 1 wherein the operational radiation comprises a an ionizing pulse.

17. Apparatus as in clause 1 wherein the control module generates a focus control signal in response determining that the reflected metrology radiation satisfies a predetermined criterion and further comprising a focusing module located in the first optical path having a first state in which a first beamwidth of radiation in the irradiation region has a first value and a second state in which a second beamwidth of radiation passing in the irradiation region has a second value.

18. A radiation source having a laser configured to have a first state in which the laser generates metrology radiation and a second state in which the laser generates operational radiation, the radiation source being responsive to a control signal to transition from the first state to the second state.

19. A radiation source having a laser configured to have a first state in which the laser generates metrology radiation having an irradiance below a predetermined value and a second state in which the laser generates operational radiation having an irradiance above the predetermined value, the radiation source being responsive to a control signal to transition from the first state to the second state.

20. Apparatus as in clause 19 wherein the predetermined value is the magnitude required to ionize target material into a plasma state.

21. An EUV source comprising:
   a radiation source including a laser configured to have a first state in which the laser generates metrology radiation and a second state in which the laser generates operational radiation, the radiation source being responsive to a control signal to transition from the first state to the second state;
   a first optical system arranged to convey the metrology radiation to a first location along a first path;
   a second optical system arranged to convey reflected metrology radiation reflected by target material; and
   a control module arranged to receive the reflected metrology radiation and configured to analyze the reflected metrology radiation and to generate the control signal based on the reflected metrology radiation.

22. A method of using a radiation source including a laser to irradiate target material, the method comprising the steps of:
   causing the laser to emit a metrology pulse;
   using the target material to reflect at least a portion of a reflected portion of the metrology pulse;
   using the at least a portion of a reflected portion of the metrology pulse to determine a position of the target material;

determining a timing for emission by the laser of an operational pulse based at least in part on the position of the target material as determined; and causing the radiation source to emit the operational pulse at the timing as determined.

23. A method of using a radiation source including a laser to irradiate target material, the method comprising the steps of:

causing the laser to emit a metrology pulse;

using the target material to reflect at least a portion of a reflected portion of the metrology pulse;

determining a timing for the laser to emit an operational pulse based at least in part on whether the at least a portion of the reflected portion meets a predetermined criterion; and causing the laser to emit the operational pulse at the timing as determined.

24. A method as in clause 23 wherein the predetermined criterion is the presence of any reflected metrology pulse.

25. A method as in clause 23 wherein the predetermined criterion is the whether the magnitude of the irradiance of the reflected portion of the metrology pulse exceeds a predetermined value.

26. A method as in clause 23 wherein the predetermined criterion is the whether the magnitude of the irradiance of the reflected portion of the metrology pulse has reached a maximum value.

27. A method of using a radiation source including a laser to irradiate target material, the method comprising the steps of:

controlling a beamwidth of a focusing module to increase the beamwidth of a beam passing through the focusing module;

causing the laser to emit a metrology pulse through the focusing module;

using the target material to reflect at least a portion of a reflected portion of the metrology pulse;

using the at least a portion of a reflected portion of the metrology pulse to determine a position of the target material;

determining a timing for emission by the laser of an operational pulse based at least in part on the position of the target material as determined;

controlling the beamwidth of a focusing module to decrease the beamwidth of a beam passing through the focusing module; and causing the laser to emit the operational pulse through the focusing module at the timing as determined.

What is claimed is:

1. A method of using a radiation source including a laser to irradiate target material, the method comprising:

causing the laser to emit a metrology pulse;

using the target material to reflect at least a portion of the metrology pulse as a reflected portion of the metrology pulse;

determining a timing for the laser to emit an operational pulse based at least in part on whether the at least a portion of the reflected portion meets a predetermined criterion; and causing the laser to emit the operational pulse at the timing as determined.

2. A method as in claim 1 wherein the predetermined criterion is the presence of any reflected metrology pulse.

3. A method as in claim 1 wherein the predetermined criterion is whether the magnitude of the irradiance of the reflected portion of the metrology pulse exceeds a predetermined value.

* * * * *